(12) United States Patent
Fenstermaker et al.

(10) Patent No.: US 6,216,241 B1
(45) Date of Patent: Apr. 10, 2001

(54) METHOD AND SYSTEM FOR TESTING MULTIPORT MEMORIES

(75) Inventors: Larry Ray Fenstermaker, Nazareth, PA (US); Frank P. Higgins, West Trenton, NJ (US); Ilyoung Kim; James Louis Lewandowski, both of Plainsboro, NJ (US); Jeffrey Jay Nagy, Allentown, PA (US)

(73) Assignee: Agere Systems Guardian Corp., Allentown, PA (US)

( * ) Notice: Subject to any disclaimer, the term of this patent is extended or adjusted under 35 U.S.C. 154(b) by 0 days.

(21) Appl. No.: 09/168,409

(22) Filed: Oct. 8, 1998

(51) Int. Cl.[7] .................................................. G11C 29/00
(52) U.S. Cl. ............................................................ 714/718
(58) Field of Search .................................... 714/718, 733, 714/724, 719

(56) References Cited

U.S. PATENT DOCUMENTS 5,436,911 * 7/1995 Mori ...................................... 714/718
5,675,544 * 10/1997 Hashimoto ............................ 365/201

OTHER PUBLICATIONS

"Testing Semiconductor Memories Theory and Practice", By A.J. van de Goor, John Wiley & Sons, Ltd., West Sussex, England, 1996 pp. 63 and 65–92.

Advertisement from Internet entitled "Aries Platform High Speed Memory Test Systems" by Teradyne, Inc., Boston, MA; (1996) pp. 1–3.

Abstract entitled "Simple and Efficient Algorithms for Functional Ram Testing" by Marian Marinescu from the 1982 IEEE Test Conference, pp. 236–239.

* cited by examiner

Primary Examiner—Phung M. Chung
(74) Attorney, Agent, or Firm—Duane Morris & Heckscher LLP; Steven E. Koffs

(57) ABSTRACT

A memory device has first and second sets of memory cells. Each of the cells in the second set is a neighboring cell corresponding to a respective cell of the first set. A data generating function generates a first pattern and a second pattern. A controller causes the first pattern to be written in the first set of memory cells, causes each cell in the second set of memory cells to be read simultaneously while the corresponding neighboring cell in the first set of memory cells is being written to, and causes a datum to be read from each cell in the second set of memory cells after the corresponding neighboring cell in the first set of memory cells is written to. An output data evaluator determines whether the data read from the second set of memory cells match the second pattern, and detects a fault in the memory device, if the data read do not match the second pattern.

19 Claims, 11 Drawing Sheets

METHOD AND SYSTEM FOR TESTING MULTIPORT MEMORIES

FIELD OF THE INVENTION

The present invention relates to electronic memories and more particularly to methods and systems for testing such memories.

DESCRIPTION OF THE RELATED ART

Multiport memories are increasingly being used for a variety of applications. They allow for simultaneous reading and writing to arbitrary addresses through separate read and write ports.

A multiport memory typically consists of a basic memory block surrounded by ancillary circuitry to provide for access and synchronization. This circuitry includes read and write address buffers and decoders, input data latches, output data buffers, normal or tristate, and a clock buffer. The data cells can be written to by latching the data into an input data latch, providing the address to be written to a write address buffer, then enabling writing. A finite specified time after the following clock edge, the addressed memory cell contains the desired data. Reading is achieved by latching the address of the data to be read into a read address buffer. After a finite amount of time, the addressed data appears on the output of the output buffers.

The presence of separate read and write ports permits concurrent reading and writing of different memory cells. If the same cell is written and read at the same time, the result of the read is undefined. The use of 2×1 multiplexers controlled by the least significant bit (LSB) of the address line in the memory block allows for two columns of cells to share one write word line.

SUMMARY OF THE INVENTION

The inventors have found that a problem can arise, if a cell is written or read using one port while an adjacent cell is being read or written, respectively, using another port. Assuming manufacturing or operational variations, the adjacent write and read lines both at the high voltage level, can produce enough current flow to cause the inverter used to store the memory bits to change a correct value to an incorrect value, or cause an incorrect value to be stored.

Thus, the inventors have discovered a type of memory fault which may cause an error when a first memory cell is written to, at the same time that a neighboring cell (having an address that is the same as that of the first cell, except for inversion of the least significant bit) is being read. Allowing both read and write ports to access neighboring memory cells simultaneously gives rise to the possibility of interference of operations on neighbor cells causing an incorrect value to be stored, or a correct value to be changed. Thus, it is desirable to implement tests which are intended to detect these failures, as well as the more traditional ones.

The present invention is a method for testing a memory device to detect a memory fault of the type described above, which causes an error to occur when a first memory cell is written to, at the same time that a neighboring cell is being read. The combination of operations which cause the error is referred to herein as, "write-disturb," and is designated by the notation, W∥D.

A memory device has first and second neighboring memory cells. The second cell is written to have a predetermined value. A first datum is in the first memory cell. The datum in the second memory cell is read at the same time that the first memory cell is being written to. If the datum read does not match a predetermined second datum, then an error is detected. The datum in the second memory cell is read again, after the W∥D step. Another comparison is made to determine whether the data read after the W∥D step match the predetermined second datum. A fault is detected in the memory device, if the data read do not match the second datum.

Further, a method according to the invention may include additional steps for detecting other types of memory faults known in the art, such as "stuck at 0/1" faults, transition faults, single static coupling faults, single dynamic coupling faults, multi-port faults, read/write logic faults, and address decoder faults.

The invention may also be embodied in apparatus for performing the test method. The apparatus may be included in a memory tester or a built-in self test circuit for a memory device. The invention may also be embodied in a computer readable medium storing computer program code for causing a computer or memory tester to perform the test method.

DETAILED DESCRIPTION OF THE INVENTION

Figure 1:
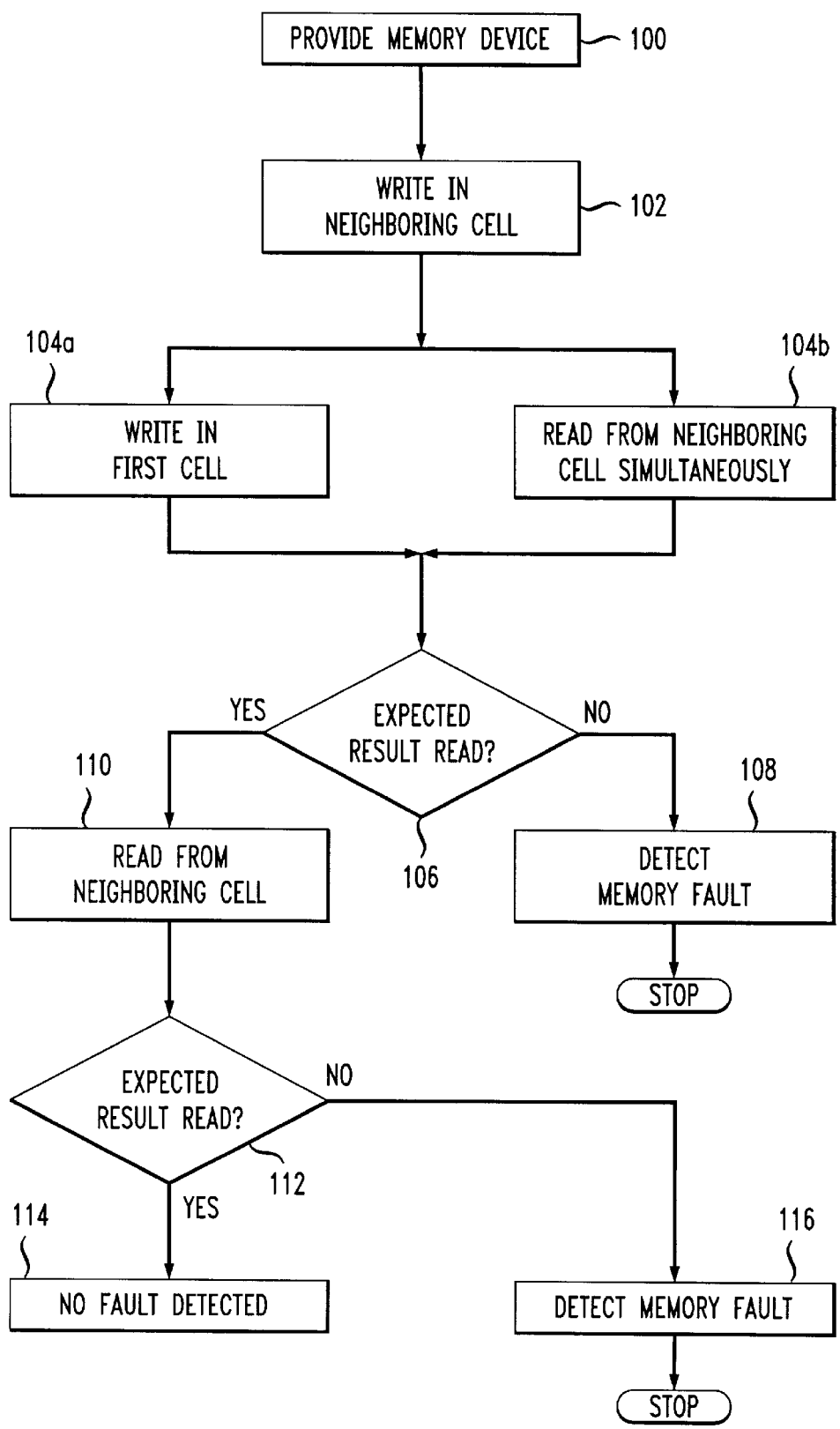
FIG. 1 is a flow chart diagram of a test method of testing a pair of memory cells according to the invention.

The inventors of the present invention have detected a type of memory fault which manifests itself in multiport memories by presenting two related types of errors. The inventors detected both of these error types in a memory, following a write operation in a first cell while a read operation is simultaneously performed in a neighboring cell. The two errors are:

(1) The simultaneous write and read cause inversion of the datum read from the neighboring cell, which is detected by the read. (This is referred to below as a "type-1 error").

(2) The read yields the expected datum, but the simultaneous write and read cause inversion of the datum read from the neighboring cell; the corruption of the data so read is only detectable during subsequent read operations. (This is referred to below as a "type-2 error").

A memory fault which may cause either of these two types of errors is referred to herein as a "multiport disturb fault," or MPDF. The present invention is a test method and test apparatus for detecting either of the above errors in a multi-port memory, to detect the presence of an MPDF.

Memory array symmetry can dictate the type of coupling between nearest neighbors in the array. In addition, both row and column multiplexing is generally utilized. With row decoding, all of the cells in the same column share the same write and read bit lines. Thus, a read operation at cell i could be affected by a write operation on cell j somewhere else in the column. Similarly, with column decoding, several cells in the same row share the same read and write word lines. While writing cell i, any cell k along the same row is also accessed via its write devices. The overhead circuitry and memory cells are designed such that cell k remains stable when the intent is not to overwrite it. The method and system of the present invention verify that any processing defects or variations have not invalidated this design criterion. For example, even though cell k remains stable as cell i is overwritten, in the presence of an MPDF, the contents of cell k may be "disturbed." If cell k is read at the same time as cell i is overwritten, then the design and a test method and system according to the present invention ensures that this additional read operation does not flip the contents of cell k.

Tests have traditionally been performed to detect the following previously known types of faults, which may be present in the memory. These faults include previously known faults such as: stuck-at 0/1 faults; transition faults; single static coupling faults; single dynamic coupling faults; read/write logic faults; and address decoder faults, etc.

In addition, some faults are specific to multiport memory operation, in particular for memories where cells share write word lines through the use of multiplexing. One example of such a fault manifests itself when multiple concurrent memory operations, for example a read and a write, cause an incorrect value to be stored, or an existing value to be changed to an incorrect one. An embodiment of the present invention detects both the previously known faults listed in the previous paragraph and the additional MPDFs.

FIG. 1 is a flow chart diagram of a method of testing a memory cell according to the invention.

At step 100, a multiport memory device, which may be a register memory, is provided. The memory has at least two memory cells.

At step 102, the memory is initialized by writing a predetermined datum (which may be a bit or a word) into a cell which is neighboring a first cell in which data is to be written during the cell test. As the term "neighboring" is used herein, a cell neighboring the first cell is a cell which has an address bearing a relationship with the address of the first cell which is likely to result in the occurrence of a "write, disturb" type error if an MPDF is present.

For example, in the present example the neighboring cell has an address which differs from the address of the first cell only in that the least significant bit (LSB) is inverted. That is, if the LSB of the address of the first cell is a "zero," the LSB of the address of the neighboring cell is a "one", and vice-versa. All other bits of the two addresses are identical.

Steps 104a and 104b are performed simultaneously to form a W∥D step. At step 104a, a datum is written to the first cell. At step 104b, the neighboring cell is simultaneously read.

Steps 106 and 108 may optionally be performed to detect type-1 errors (as defined above).

At step 106, the datum read in step 104b is compared to the predetermined datum written to the neighboring cell in step 102. In the absence of an MPDF, the two data are expected to be identical.

At step 108, if the datum read in step 104b does not match the datum written at step 102, then an MPDF is present in the memory device. Note that the converse may not be true; if the datum read in step 104b matches the datum written at step 102, then an MPDF may still be present in the memory device, and cannot be ruled out at this point in the test.

As noted above, an MPDF may cause corruption of the datum in the neighboring cell which is detectable on the following read cycle, but not manifested at the time of the W∥D step (a type-2 error). Thus, if steps 106 and 108 are performed, and the datum read at step 104b matches the datum written at step 102, a type-2 error cannot yet be ruled out, and a further check is made, as described below.

At step 110, the contents of the neighboring cell are read, after the W∥D step of step 104b. At step 112, the datum read in step 110 is compared to the predetermined datum written to the neighboring cell in step 102. In the absence of an MPDF, the two data are expected to be identical.

At step 114, if the datum read in step 110 matches the datum written at step 102, then no MPDF is detected.

At step 116, if the datum read in step 110 does not match the datum written at step 102 (either a type-1 or a type-2 error), then an MPDF is present in the memory device.

Because it is possible to detect an MPDF by the presence of a type-2 error at step 116, the read operation at step 110 is needed if the data match in step 106. For this reason, it is possible to vary the embodiment of FIG. 1 by omitting steps 106 and 108 altogether. Steps 110–116 can detect both the type-1 and type-2 error types associated with an MPDF, as described above. Nevertheless, detection of an error at step 108 indicates the presence of an MPDF; if the test method according to the invention is implemented in software, it is possible to skip steps 110 to 116 if an error is detected at step 108, and only perform steps 110 to 116 if no error is detected at step 108. Once a fault is detected, execution may be terminated (Further testing is not needed if the memory chip is to be discarded).

Figure 2:
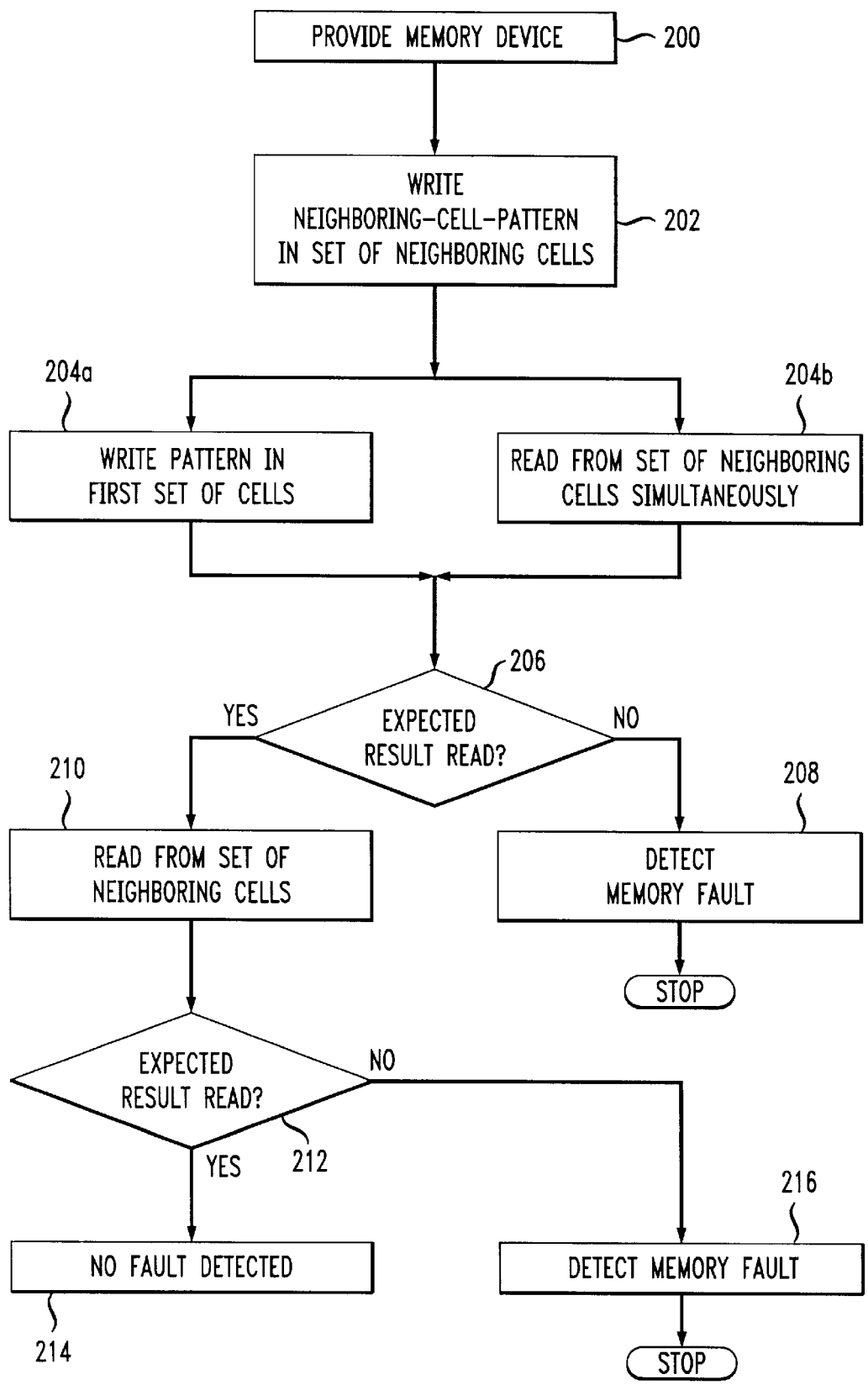
FIG. 2 is a flow chart diagram of a method of testing a memory device having a plurality of memory cells, according to a variation of the test method of FIG. 1.

FIG. 2 is a flow chart diagram of a method for testing a memory device having a plurality of cells.

At step 200, a memory device is provided. The device has first and second sets of memory cells. Each of the cells in the second set is a neighboring cell corresponding to a respective cell of the first set.

At step 202, the memory device is initialized by writing a predetermined (second or neighboring cell) pattern of data into the second set of cells, which comprises the cells neighboring the first set of cells. An exemplary pattern is 010101, . . . , 01. A further exemplary pattern is 101010, . . . , 10.

At steps 204a and 204b, the W∥D step is performed. At step 204a, a first pattern is written in the first set of memory cells. Preferably, each bit in the first pattern is the inverse of the corresponding bit written at step 202. For example, if the pattern 010101, . . . , 01 is written at step 202, then 101010, . . . , 10 would be written at step 204a. At step 204b, a datum is read from each cell in the second set of memory cells at the same time that the corresponding neighboring cell in the first set of memory cells is being written to in step 204a.

At steps 206 and 208, an optional comparison is made to determine whether the second cell pattern read during step 204b matches the pattern written at step 202. If the patterns do not match, an MPDF is detected at step 208. These steps are optional for the same reasons that steps 106 and 108 are optional, as described above.

At step 210, a datum is read from each cell in the second set of memory cells after executing steps 204a and 204b.

At step 212, a determination is made whether the data read in step 210 match the predetermined second pattern written at step 202.

At step 214, no fault is detected in the memory device, if the data read in step 210 match the second pattern written at step 202.

At step 216, a fault is detected in the memory device, if the data read in step 210 do not match the second pattern written at step 202.

As is understood by one skilled in the art, the procedure of FIG. 2 may be repeated with the patterns reversed. The second set of cells is initialized by writing the first pattern to the second set of cells. Then the W∥D step is performed by writing the second pattern to the first set of cells and simultaneously reading from the second set of cells.

Figure 3:
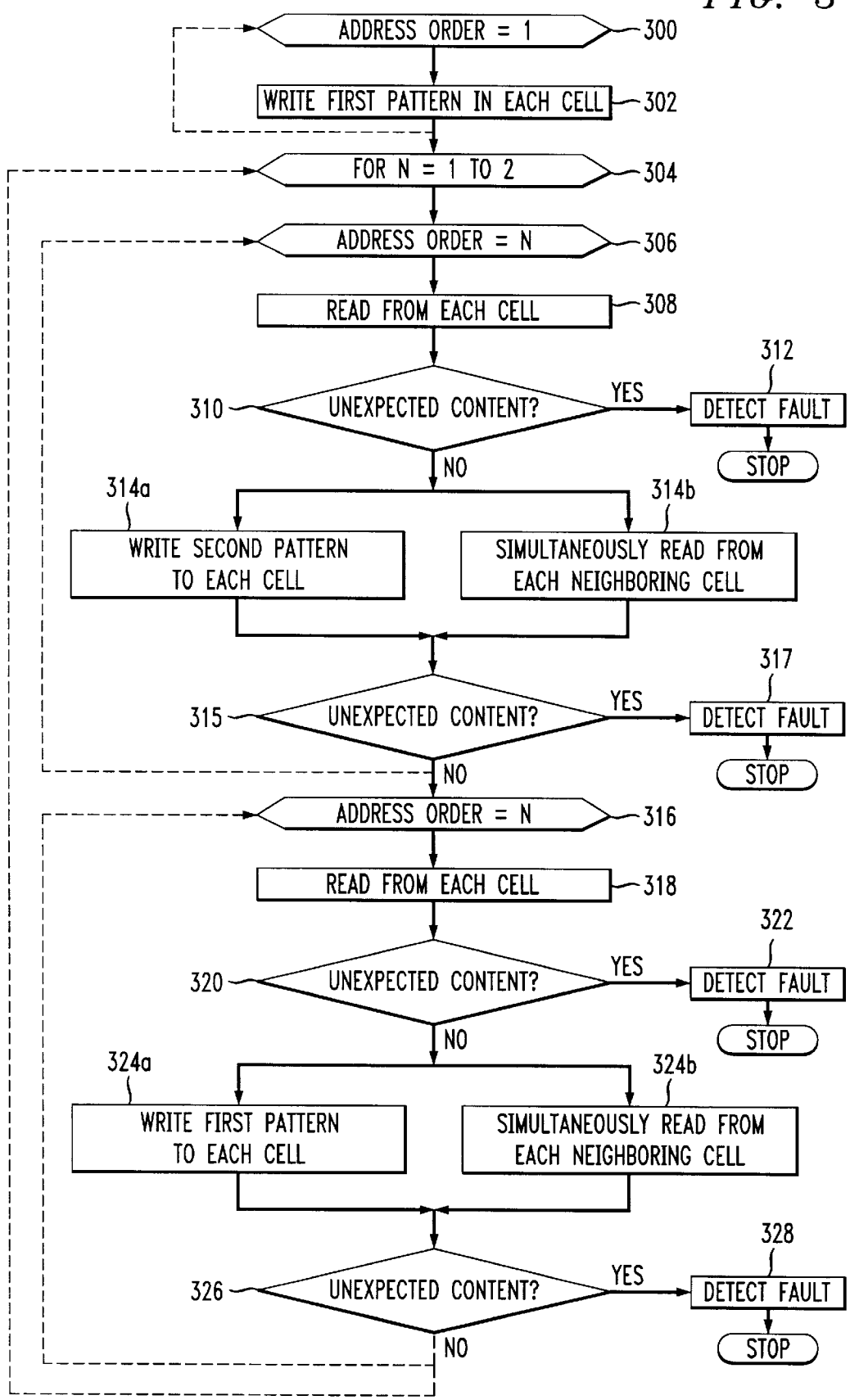
FIG. 3 is a flow chart diagram of another method of testing a memory device using a variation of the method of testing a memory device using the test method of FIG. 1.

The principals explained Referring now to FIG. 3, there is shown a flow diagram depicting the steps of a method for built-in self testing of imbedded multiport memories for the presence of MPDF cell disturb problems, in accordance with the present invention. Modifications of methods designed for single shared read/write port memories, to include memory cell disturb testing as well as traditional fault coverage, are described below in connection with FIGS. 4A–4D. The description which follows employs notations which are also used by A. J. van de Goor in the book "*Testing Semiconductor Memories Theory and Practice*", John Wiley & Sons Ltd., West Sussex, England, 1996, which book is incorporated by reference as if fully set forth herein.

At this point, a series of march tests is introduced. March tests are described at page 69 in the text by A. J. van de Goor. A march test includes a finite sequence of march elements. A march element is a finite sequence of operations applied to every cell in memory before proceeding to the next march element. This may be in either of two address orders: an increasing ($\uparrow$) address order (from address 0 to address n−1, for an n cell memory), or a decreasing ($\downarrow$) address order (from address n−1 to address 0, for an n cell memory). Thus, according to these definitions, the notation $\downarrow_0^{M-1}$ means to proceed through the entire address base starting at the largest address M−1 and finishing at the smallest address 0 for an M word memory. The notation $\uparrow_0^{M-1}$ denotes a similar operation, but in the opposite direction. Finally, the notation W∥D denotes a write cycle run concurrently with a read, disturb cycle performed on the neighboring cell. The address of this neighboring cell is determined by inverting the LSB of the current address.

The notation $Op_{pat}$ means apply operation Op where Op is either W for a write or R for a read at the current address location using data pattern pat. Thus the notation Wp and Wq indicate writing the patterns p and q, respectively. The notation Rp and Rq indicate reading the contents of a set of cells, with the expectation that the contents are to be p and q, respectively. In the absence of a memory fault, the result of the Rp and Rq operations is that the patterns p and q, respectively, are read. In the presence of a memory fault, such as an MPDF type fault, the contents of the cells read during either the Rp or Rq steps may differ from the patterns p and q, respectively, enabling detection of an MPDF fault.

Any two patterns p and q may be used. Preferably, each bit (or byte) in the pattern q is inverted from the corresponding bit (or byte) in the pattern p. A typical sample of patterns that can be used is:

p=1010, . . . , 1010
q=0101, . . . , 0101

A memory cell disturb "core algorithm" for testing a memory device is now described with reference to FIG. 3.

The leaf cell disturb test method of FIG. 3 includes the following five march elements. Each march element is used to detect some faults while sensitizing others. Both of the above-described address orders are used to get full detection. The specifics of fault coverage will be described below in connection with FIG. 3.

I. $\downarrow_0^{M-1}$Wp
II. $\downarrow_0^{M-1}$Rp; Wq∥D;
III. $\downarrow_0^{M-1}$Rq; Wp∥D
IV. $\uparrow_0^{M-1}$Rp; Wq∥D;
V. $\uparrow_0^{M-1}$Rq; Wp∥D March element I requires sufficient time for one write operation to each cell. March elements II through V each require sufficient time for one read operation and one write operation to each cell. (The W∥D operation takes the same amount of time as a write operation). Thus the total number of read and write operations to perform this test is 9M, for an M word memory.

FIG. 3 is a flow chart diagram showing march elements I through V.

At steps 300 and 302, march element I (Wp) is performed to initialize the memory, which is assumed to be an M word memory. In accordance with march element I, the system proceeds through the entire address space, beginning at the largest address M−1 and ending at the smallest address 0, writing a first pattern p to the memory cell at the current address location. The dashed line indicates that the write operation is performed to each cell before proceeding to march element II.

At step 304, the address order (N) for march elements II to V is set. March elements II and III (steps 306 through 328) are performed in the first address order (N=1). March elements IV and V include the same operations as in march elements II and III, performed in the second address order (N=2), which is opposite the first address order.

Steps 306 to 317 form march element II, when the first address order is used, and march element IV, when the second address order is used.

During the first pass, at step 308, a read is performed, with the expectation that the cells read contain the first pattern p. This is the Rp operation.

At step 310, the contents are compared to the first pattern p.

If any cell has an unexpected content (i.e., something different from the first pattern p), then at step 312, a fault is detected.

At steps 314a and 314b, the write-disturb step Wq∥D is performed by writing the second pattern q to the cells in step 314a, while step 314b simultaneously reads a neighboring cell corresponding to the current cell that is written in step 314a. Note that the purpose of the read at step 314b is to perform the disturb test; the contents read at step 314b may be discarded.

At steps 315 and 317, an optional comparison is made to determine whether the second cell pattern read during step 314b matches the first pattern p written at step 302. If the patterns do not match, an MPDF is detected at step 317. These steps are optional for the same reasons that steps 106 and 108 are optional, as described above.

Steps 306 through 315 are repeated at every cell, to complete march element II.

At step 316, march element III is initialized.

At step 316, during the first pass (i.e., using the first address order), march element III is performed.

At step 318, data are read from the current memory cell. This is the Rq operation.

At step 320, the data read are compared to the expected (second) pattern q.

At step 322, if any cell has an unexpected content, a fault is detected.

At steps 324a and 324b, the write-disturb step Wp∥D is performed by writing the first pattern p to the cells in step 324a, while step 324b simultaneously reads a neighboring cell corresponding to the current cell that is written in step 324a. Control is returned to step 304.

At steps 326 and 328, an optional comparison is made to determine whether the second cell pattern read during step 324b matches the second pattern q written at step 314a. If the patterns do not match, an MPDF is detected at step 328. These steps are optional for the same reasons that steps 106 and 108 are optional, as described above.

At step 304, the address order N is set to the second addresses order, for executing steps 306 to 328 in the second address order opposite the first address order.

March element IV is performed by executing steps 306 to 317 in the second address order.

March element V is performed by executing steps 316 to 328 in the second address order.

TABLE 1 summarizes the fault detection and sensitization capabilities for the test method, assuming that the first address order in march elements I to III proceeds from the highest address to the lowest, and that the second address order in march elements IV to V proceeds from the lowest address to the highest. The cells are sensitized by writing a known pattern. The x/y notation used denotes that the initial value of the cell is x and the value after the write-disturb (W∥D) step is y. For example, in the sensitization phase of March Element II, the initial value of the cell having the higher address is q and the value after the disturb event is p. As indicated in TABLE 1, all disturb patterns are detected in both neighbor cells (i.e., in both the higher and lower address cells).

TABLE 1

| March Elem. | Sensitize | | Allow Detection of Multi-Port Disturb Fault (MPDF) | |
|---|---|---|---|---|
| | Lower Address | Higher Address | Lower Address | Higher Address |
| I | | | | |
| II | p/q | q/p | p/q | |
| III | q/p | p/q | q/p | q/p |
| IV | q/p | p/q | | p/q |
| V | p/q | q/p | q/p | q/p |

Note that in march element II, a lower address cell is sensitized by writing q to the higher order address while the lower address cell (neighboring cell) is disturbed by a simultaneous read. The actual detection of whether a fault is present occurs (during march element II) when the march proceeds to read the neighboring cell (lower address cell), with the expectation of finding p.

The method of FIG. 3 is specifically adapted to detect MPDF faults. As noted above, preferably, tests are also performed to detect the presence of other previously known types of memory faults. Examples of tests specifically directed to the previously known types of memory faults is provided in Marinescu, Marian, "Simple and Efficient Algorithms for Functional RAM Testing," 1982 IEEE Test Conference proceedings, Paper 10.2, pp 236–239, 1982, which is incorporated by reference herein in its entirety. For example, Marinescu describes an "Algorithm B," which is adapted for a fault model including stuck-at faults and idempotent influences.

FIGS. 4A–4D show the steps of a modification of the above-described method of FIG. 3, to provide coverage for not only previously known types of RAM faults, but also for memory cell disturb faults. This method detects MPDF faults, as detected by the method of FIG. 3, and also detects faults of the previously known types detected by Marinescu's Algorithm B.

The description which follows employs the same notations used above.

The modified leaf cell disturb test method of FIGS. 4A–4D includes the following five march elements. Each march element is used to detect some faults while sensitizing others and different march directions are used to get full detection.

I. $\downarrow_0^{M-1} Wp$
II. $\downarrow_0^{M-1} R_p; W_q\|D; W_p; W_q;$
III. $\downarrow_0^{M-1} R_q; W_p\|D; R_p; W_q;$
IV. $\uparrow_0^{M-1} R_q; W_p\|D; W_q; W_p;$
V. $\uparrow_0^{M-1} R_p; W_q\|D; R_q; W_p;$ As with the above described method of FIG. 3, a typical sample of patterns that may be used is:
p=1010 . . . 1010
q=0101 . . . 0101

Figure 4A:
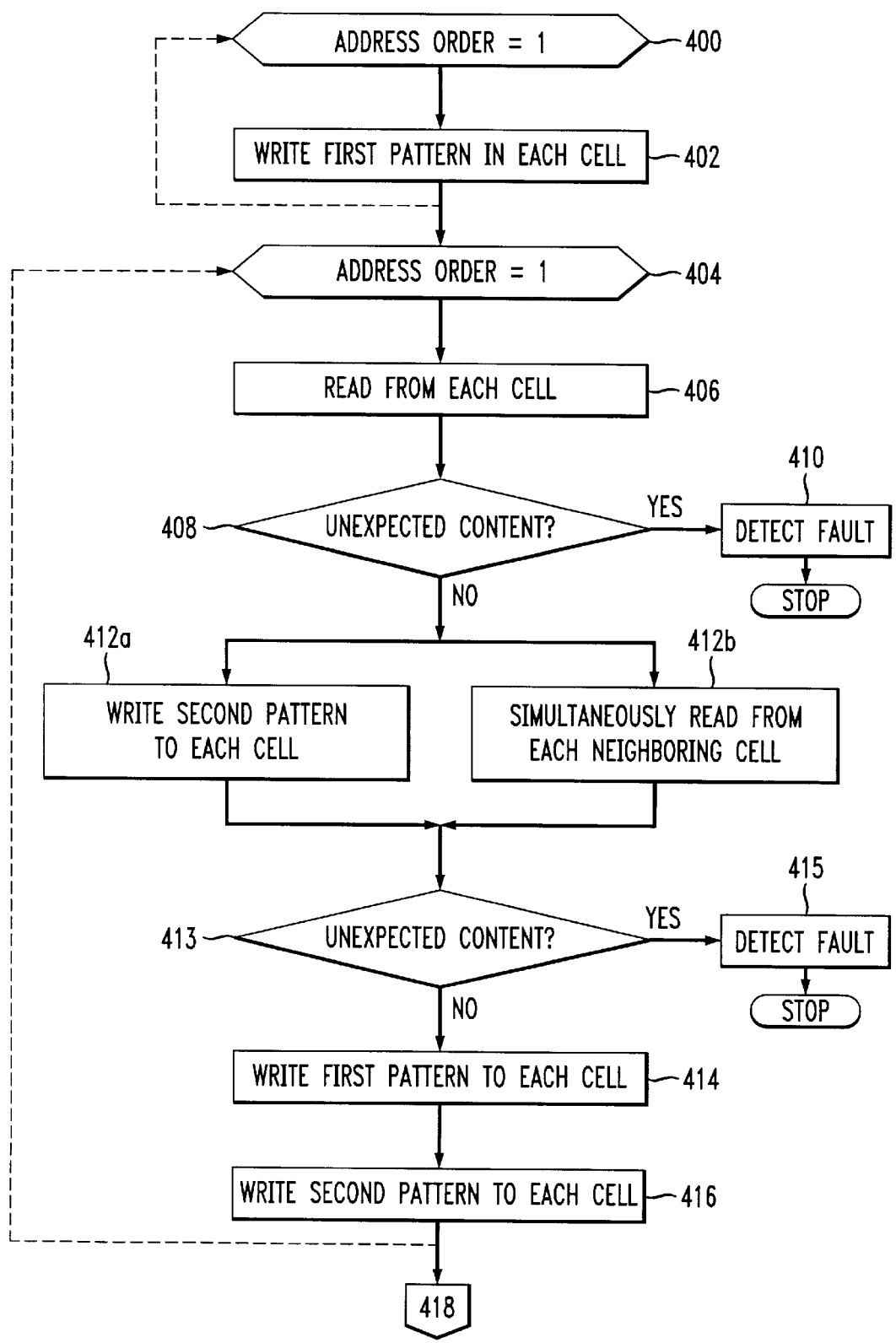
FIGS. 4A–4D are flow chart diagrams of another method of testing a memory device using a variation of the method of testing a memory device using the test method of FIG. 1.

FIG. 4A is a flow chart diagram showing march elements I and II. March element I includes steps 400 and 402. March element II includes steps 404–416. Both march elements I and II follow the same address order. In the example, the first address order begins at the largest address M−1 and ends at the smallest address 0.

At steps 400 and 402, march element I is used to initialize the memory which is assumed to be an M word memory. In accordance with march element I, the system proceeds through the entire address space, writing pattern p at each consecutive address location.

Steps 404 to 416 form the second march element. The loop of steps 406–416 is repeated for each element.

Steps 406–408 form the $R_p$ step. At step 406, data are read from the current of the memory cells.

At step 408, the contents are compared to the expected pattern p.

At step 410, a fault is detected if the current cell has an unexpected content.

Steps 412a and 412b form the $W_q\|D$ step. The second pattern q is written to the current cell while simultaneously reading data from the respective neighboring cell as the current cell is written.

At steps 413 and 415, an optional comparison is made to determine whether the second cell pattern read during step 412b matches the expected first pattern p. If the patterns do not match, an MPDF is detected at step 415. These steps are optional for the same reasons that steps 106 and 108 are optional, as described above.

Step 414 is a $W_p$ step of writing the first data pattern p to the current memory cells.

Step 416 is a $W_q$ step of writing the second data pattern q to the current memory cells.

Figure 4B:
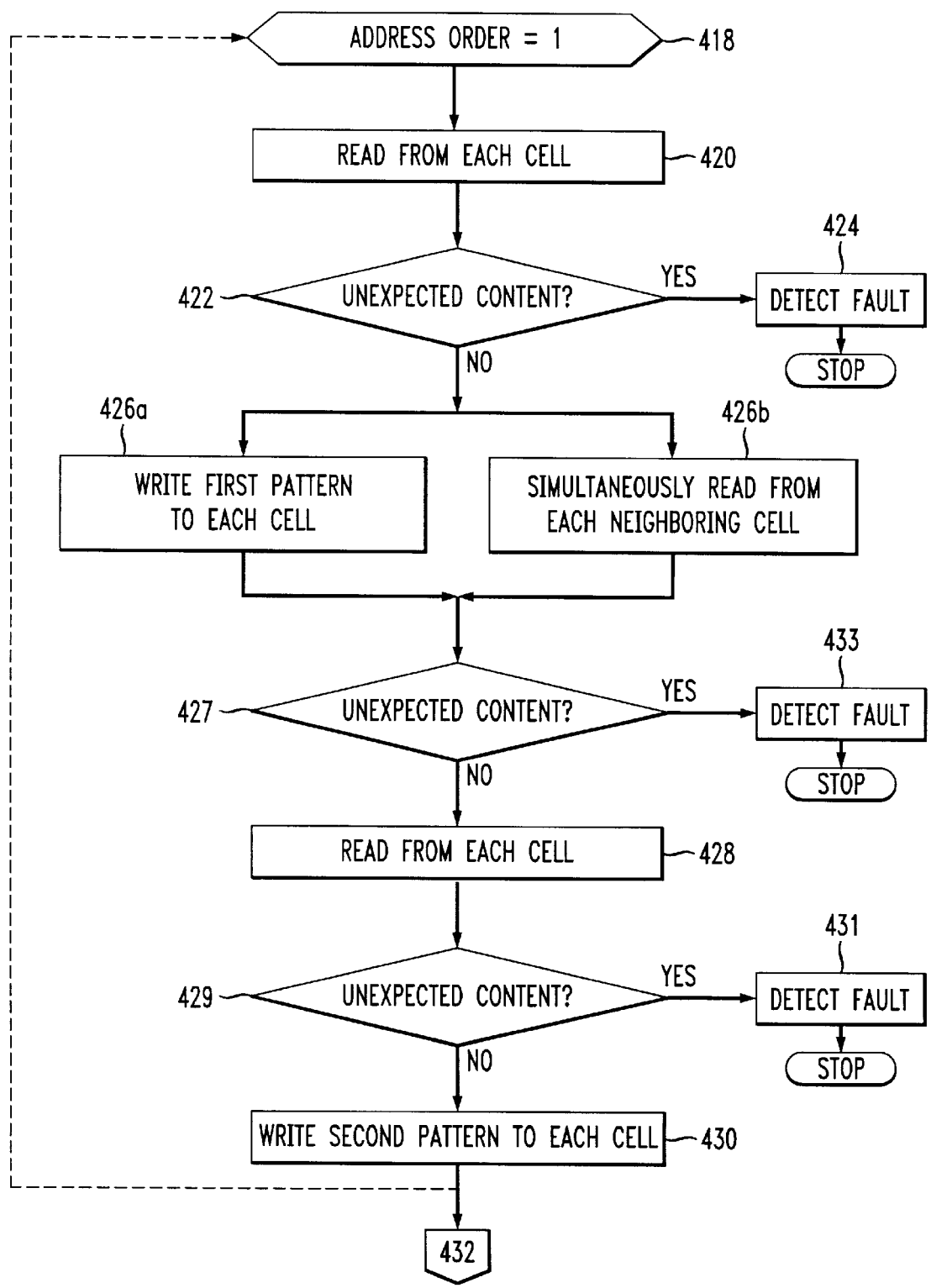

FIG. 4B is a flow chart diagram showing march element III. March element III includes steps 418–430. March element III follows the same address order as march elements I and II. The loop of steps 418–430 is repeated for each element.

Steps 420–424 form the $R_q$ step. At step 420, data are read from the current memory cells.

At step 422, the contents are compared to the expected pattern p.

At step 424, a fault is detected if the current cell has an unexpected content.

Steps 426a and 426b form the $W_p\|D$ step. The first pattern p is written to the current cell while simultaneously reading data from the respective neighboring cell as the current cell is written.

At steps 427 and 433, an optional comparison is made to determine whether the second cell pattern read during step 426b matches the expected second pattern q. If the patterns do not match, an MPDF is detected at step 433. These steps are optional for the same reasons that steps 106 and 108 are optional, as described above.

Step 428 is a $R_p$ step of reading data from each of the memory cells, expecting the first pattern p.

At steps 429 and 431, a comparison is made to determine whether the second cell pattern read during step 428 matches the expected first pattern p. If the patterns do not match, an MPDF is detected at step 431.

Step 430 is a $W_q$ step of writing the second data pattern q to each of the memory cells.

Steps 418–430 are repeated for each of the cells.

Figure 4C:
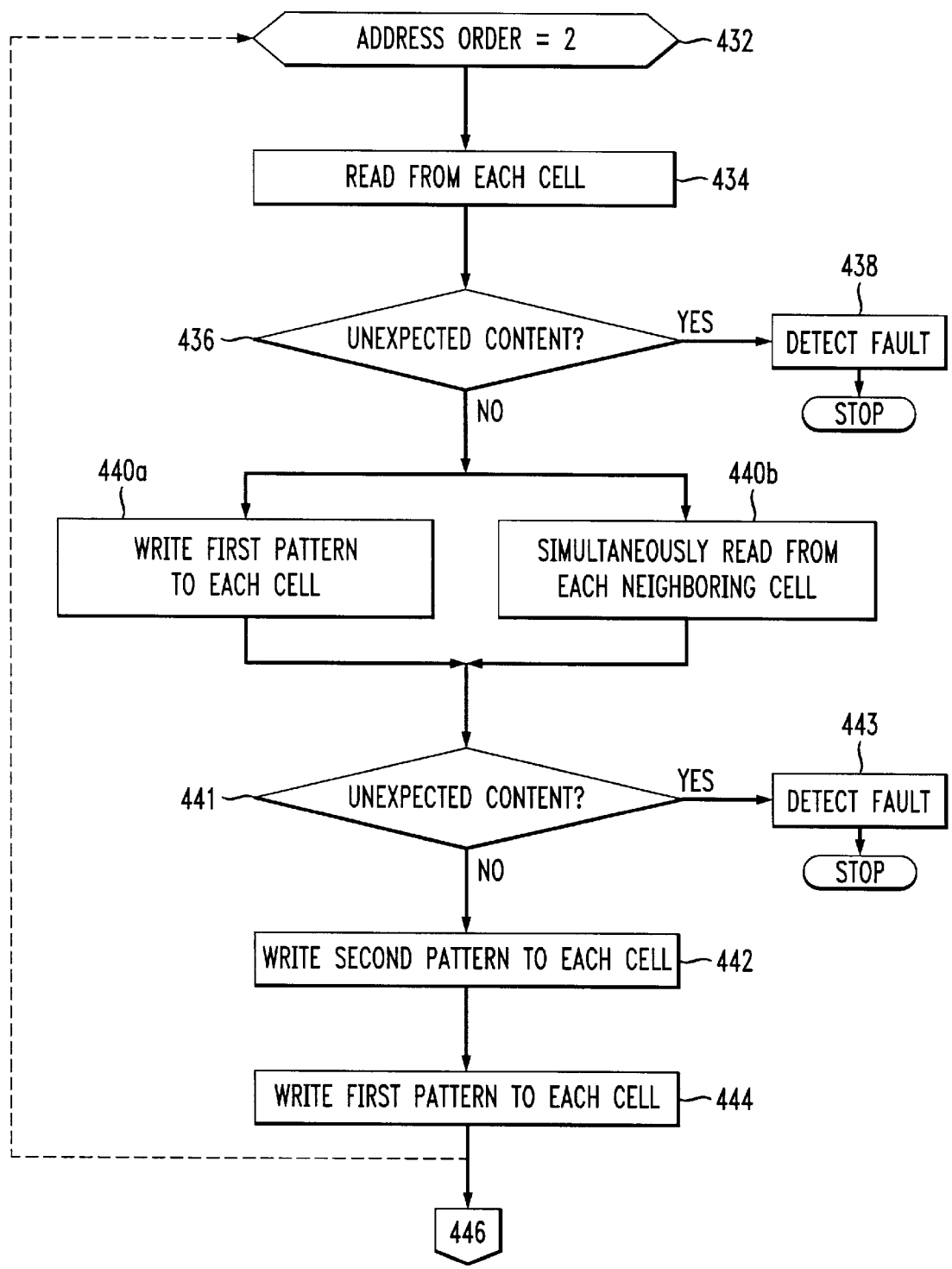

FIG. 4C is a flow chart diagram of the fourth march element.

At step 432, the address order for the fourth march element is the opposite of the address order used in march elements I–III.

Steps 434–438 form the $R_q$ step. At step 434, data are read from the current memory cells.

At step 436, the contents are compared to the expected pattern p.

At step 438, a fault is detected if the current cell has an unexpected content.

Steps 440a and 440b form the $W_p \| D$ step. The first pattern p is written to the current cell while simultaneously reading data from the respective neighboring cell as the current cell is written.

At steps 441 and 443, an optional comparison is made to determine whether the second cell pattern read during step 440b matches the expected second pattern q. If the patterns do not match, an MPDF is detected at step 443. These steps are optional for the same reasons that steps 106 and 108 are optional, as described above.

Step 442 is a $R_q$ step of reading data from the current memory cells, expecting the second pattern q.

Step 444 is a $W_p$ step of writing the first data pattern p to the current memory cells.

Steps 432–444 are repeated for each of the cells.

Figure 4D:
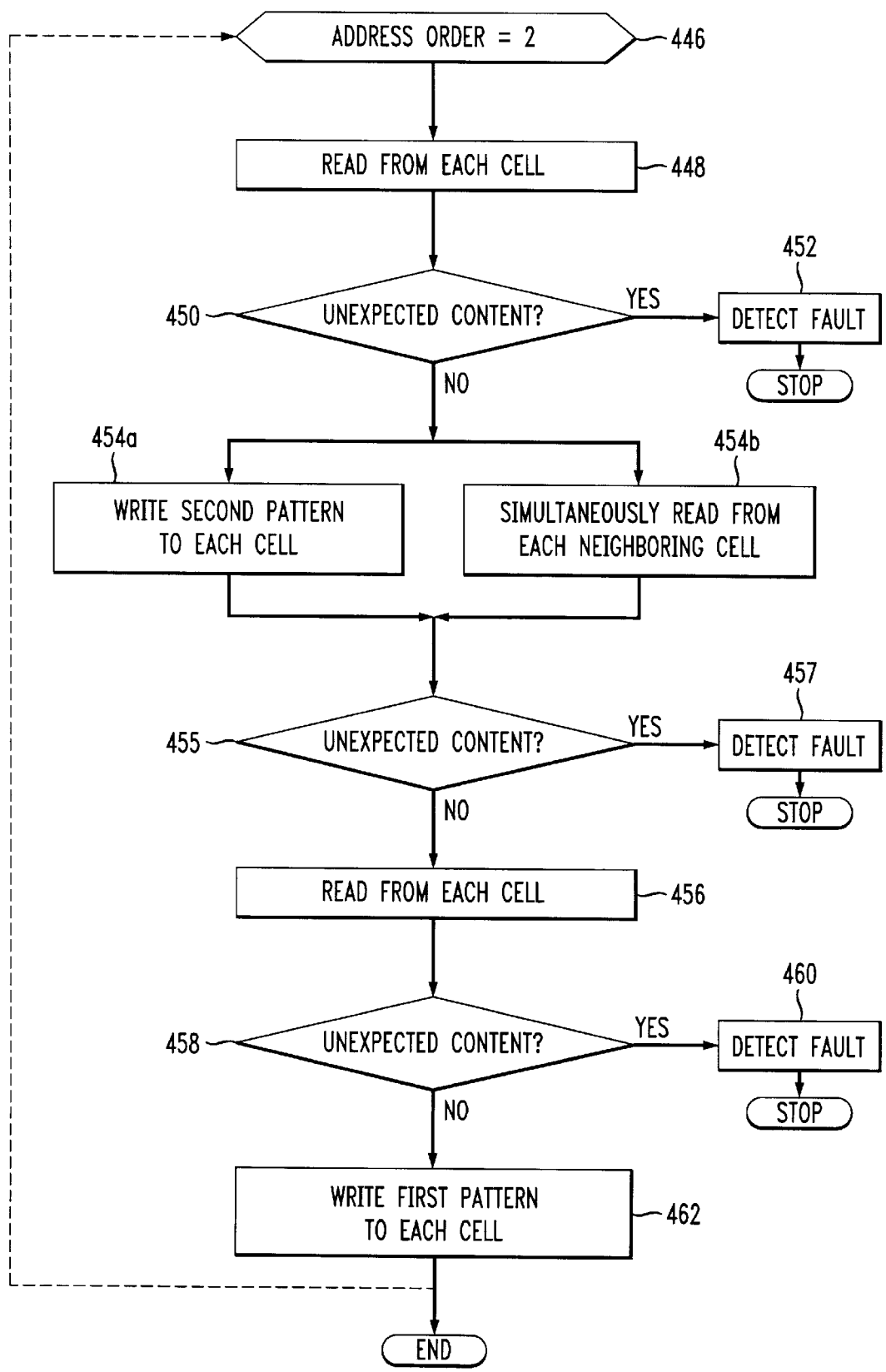

FIG. 4D is a flow chart diagram of the fifth march element. The address order for the fifth march element is the same as that used for the fourth march element.

Steps 446–462 form the fifth march element. The loop of steps 448–462 is repeated for each element of the memory device.

Steps 448–450 form the $R_p$ step. At step 448, data are read from each of the memory cells.

At step 450, the contents are compared to the expected pattern p.

At step 452, a fault is detected if any cell has an unexpected content.

Steps 454a and 454b form the $W_q \| D$ step. The second pattern q is written to each cell while simultaneously reading data from the respective neighboring cell as each cell is written.

At steps 455 and 457, an optional comparison is made to determine whether the second cell pattern read during step 444 matches the expected first pattern p. If the patterns do not match, an MPDF is detected at step 457. These steps are optional for the same reasons that steps 106 and 108 are optional, as described above.

Steps 458–460 form the $R_p$ step. At step 458, data are read from each of the memory cells.

At step 458, the contents are compared to the expected pattern p.

At step 460, a fault is detected if any cell has an unexpected content.

Step 462 is a $W_p$ step of writing the first data pattern p to each of the memory cells.

After steps 448–462 are performed for each cell, the fifth march step is completed.

TABLE 2 summarizes the memory disturb fault detection and sensitization capabilities for the test method of FIGS. 4A–4D after the memory has been initialized in accordance with Step I. This coverage is in addition to the fault coverage provided by the previously described method. The notations used in TABLE 2 are the same as those used in TABLE 1. As shown in TABLE 2, all disturb patterns are detected in both neighbor cells.

TABLE 2

| March Elem. | Sensitize | | Detect | |
| --- | --- | --- | --- | --- |
| | Lower | Higher | Lower | Higher |
| I | | | | |
| II | p/q | q/p | p/q | |
| III | q/p | q/p | q/p | q/p |
| IV | p/q | q/p | | q/p |
| V | p/q | p/q | p/q | p/q |

March element I requires sufficient time for one write operation to each cell. March elements II and IV each require sufficient time for one read operation and three write operations to each cell. March elements III and V each require sufficient time for two read operation and two write operations to each cell. Thus the total number of read and write operations performed by the method of FIGS. 4A–4D is 17M, for an M word memory, which is the same as the Algorithm B described in the paper by Marinescu referenced above.

One of ordinary skill in the art appreciates that many variations of the test algorithm may be used. The test algorithm may, for example, be varied to detect stuck-at faults, transition faults, stuck-at-open faults, multi-access port faults, static single coupling faults, dynamic single coupling faults, linked transition and coupling faults, and addressing faults, etc.

Figure 5:
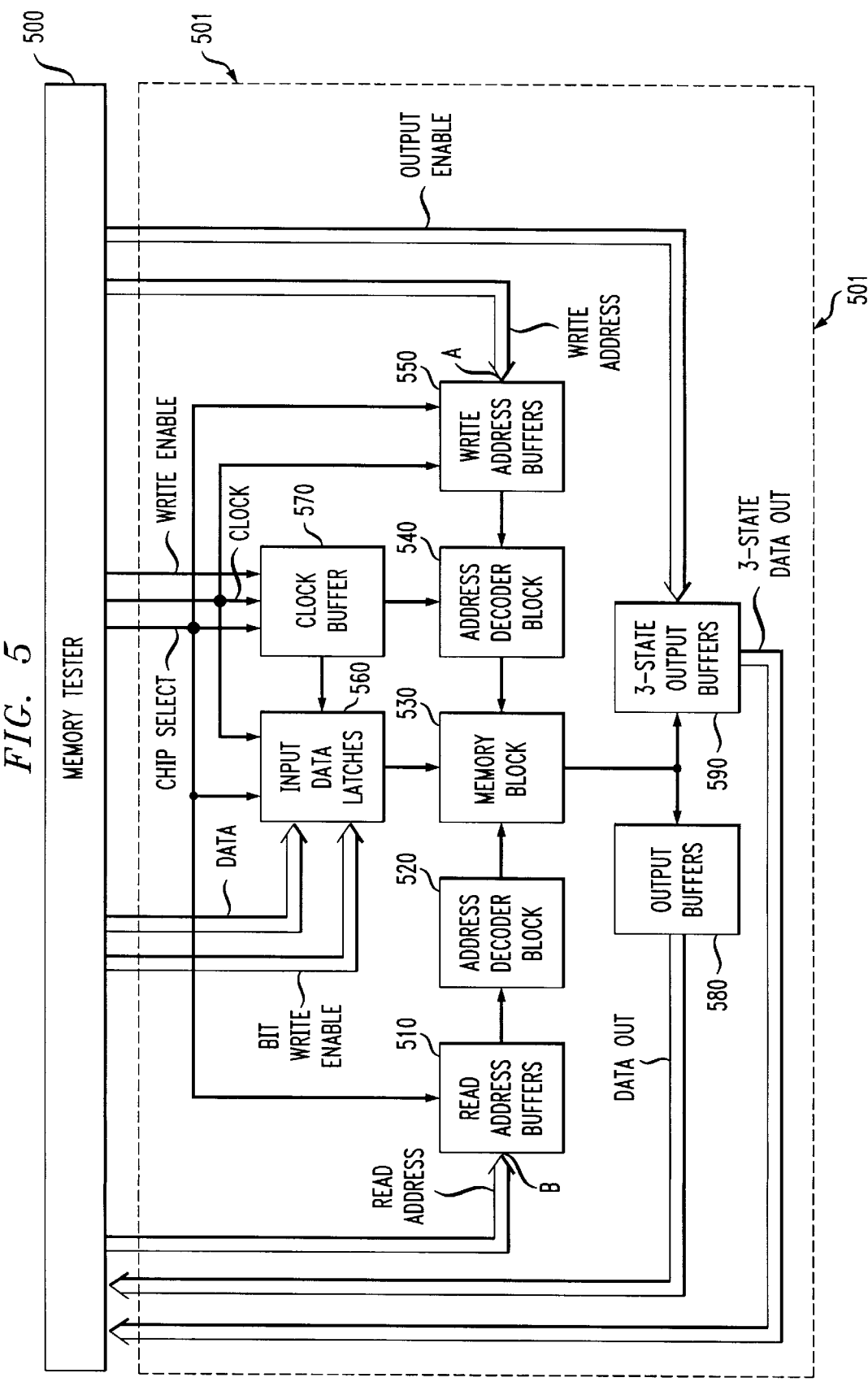
FIG. 5 is a block diagram of a first test system using a method according to the invention.
Figure 6:
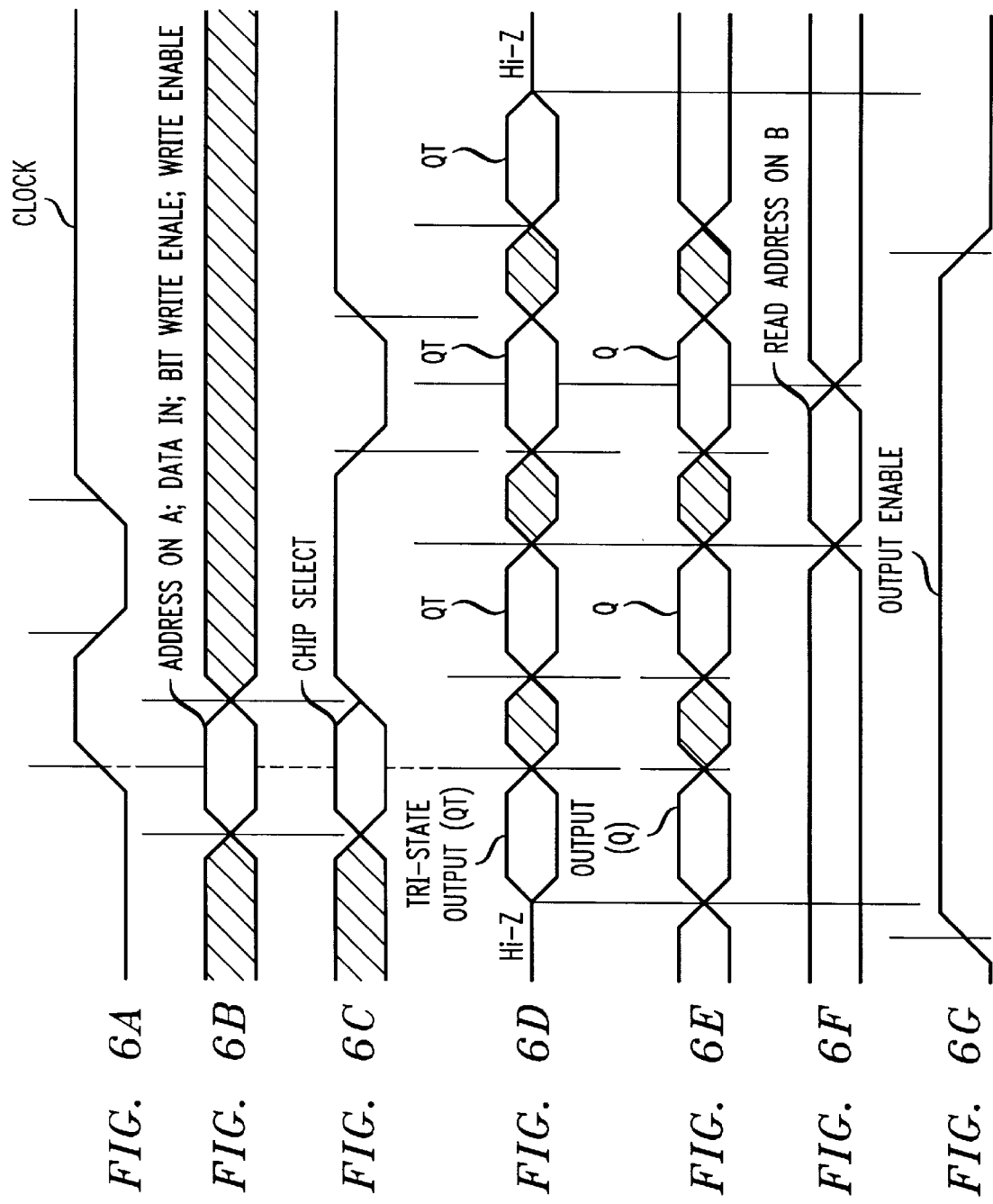
FIGS. 6A–6G are timing diagrams for the system of FIG. 5.

FIG. 5 is a block diagram showing a memory tester 500 for implementing any of the above described variations of the write-disturb test algorithm, as shown in FIGS. 1, 2, 3 or 4A–4D. FIGS. 6A–6G are a timing diagram for testing the memory system of FIG. 5. Memory tester 500 may be implemented using a memory tester, (such as the "Aries Platform"™ high speed memory test system manufactured by Teradyne, Inc. of Boston, Mass.), programmed with custom software to implement the above described algorithm. Other programmable memory testers may also be used.

A memory device 501 on which the invention may be practiced is a dual port memory, which may be a No. HL250C 3.3 Volt, 0.25 μm CMOS register file memory manufactured by Lucent Technologies, Inc., Allentown, Pa.

Memory 501 permits simultaneous reading and writing. Memory tester 500 provides a single clock signal (FIG. 6A) to clock buffer 570, for proper synchronous write operations. Memory tester 500 provides the write address on port A, input data and write enable signals to the positive edge-triggered input latches 560. The input data latches 560 and the address decoder block 540 both use the common clock signal from clock buffer 570. Memory tester 500 provides a single chip select signal (FIG. 6C) to the read address buffers 510, input data latches 560 and write address buffers 550.

Write operations (FIGS. 6B and 6C) are performed synchronously, by providing the write address to write address buffers 550 through port A, the chip select signal and the write enable signal to clock buffer 570, and the data and bit write enable signals to input data latches 560.

Read operations are performed asynchronously by providing the chip select signal and read address (FIG. 6F) to the read address buffers 510 through port B, and the output enable signal (FIG. 6G) to the tri-state output buffers 590. The tri-state output signal (FIG. 6D) is provided by tri-state output buffers 590, and a two-state output signal (FIG. 6E) is provided by output buffers 580. Because the read port is not clocked, it may be driven by either asynchronous signals, or from internally derived addresses from either negative or positive edge flip-flops. To perform the W‖D operation, the timing of the read address signal is set relative to the positive edge of the clock, so that the write to a first cell and the read from the neighboring cell occur simultaneously.

Memory tester 500 provides the capability to program in a predetermined sequence of read, write and W‖D operations, perform the programmed read, write, and W‖D operations, and collect and evaluate the output data.

A memory tester is commonly used for testing the memory devices in a manufacturing facility. Alternatively, additional built-in self test (BIST) circuitry may be used to supply the data and signals to, and analyze the responses from, the memory during the built in self test operations. These would typically include a test pattern generator (TPG) to produce test input patterns for the data and address ports and an output data evaluator (ODE) to verify the output data from the output data port. Additional circuitry, possibly implemented as a finite state machine, would be used to supply additional inputs or signals and to control the built in self test operation. Although this circuitry may be implemented in a device or devices external to the memory (e.g., for factory testing), it is preferred that the circuitry be implemented as part of the memory device itself; for example, implemented in circuitry on the same integrated circuit as the memory itself.

According to a further aspect of the invention, a memory device has first and second sets of memory elements. Each of the elements in the second set is a neighboring element corresponding to a respective element of the first set. A data generating means generates a first pattern and a second pattern. Control means cause the first pattern to be written in the first set of memory elements. The control means causes each element in the second set of memory elements to be read at the same time that the corresponding neighboring element in the first set of memory elements is being written to, and causes a datum to be read from each element of the second set of memory elements after the corresponding neighboring element in the first set of memory elements is written. Means are provided for determining whether the data read from the second set of memory elements match the second pattern, and detecting a fault in the memory device, if the data read do not match the second pattern.

Figure 7:
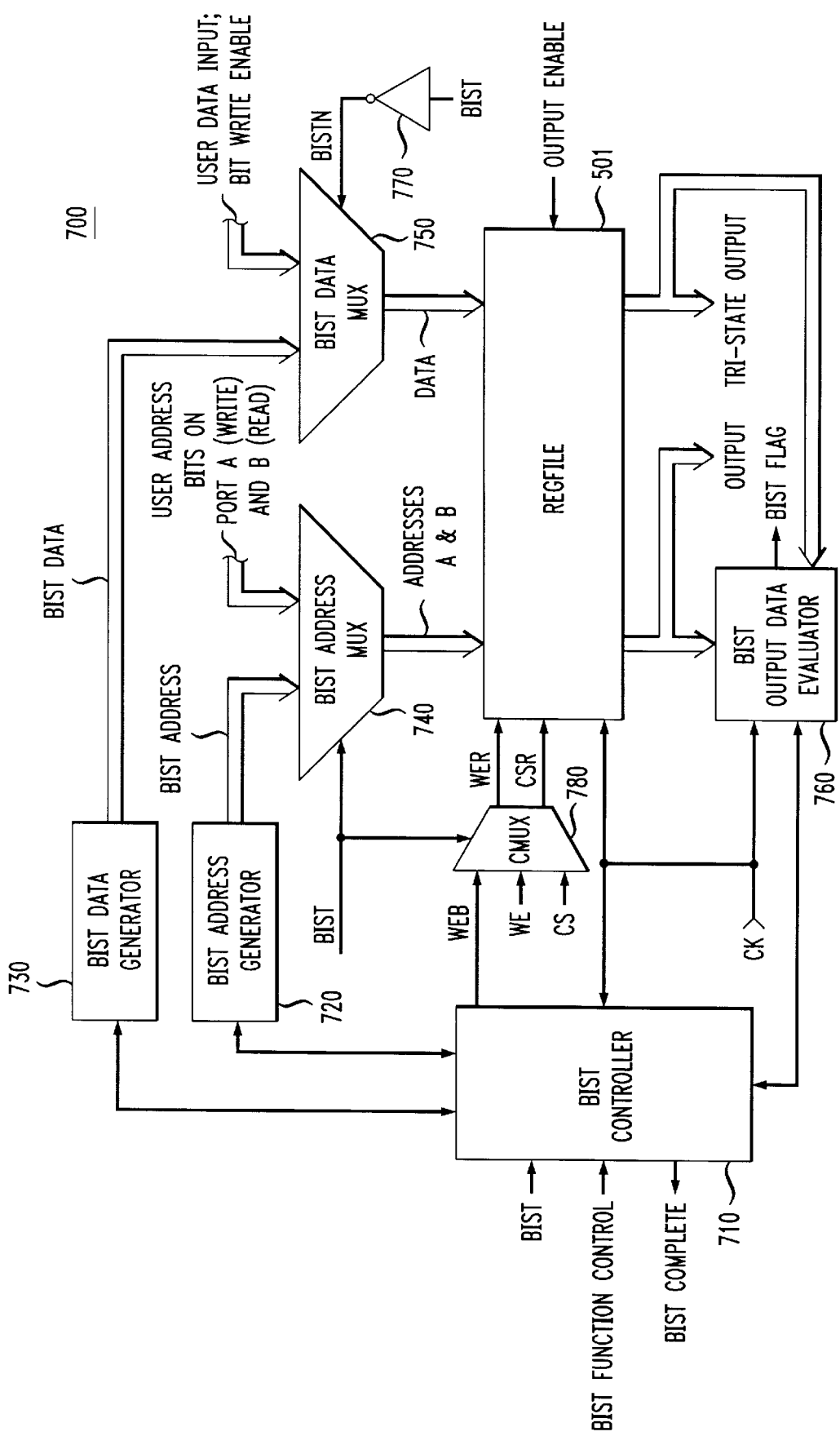
FIG. 7 is a block diagram of a memory having a built in self-test function using a method according to the invention.

FIG. 7 is a block diagram of a second exemplary apparatus 700 according to the invention. Apparatus 700 includes the dual port register file memory 501 of FIG. 5, with additional cell BIST circuitry. For simplicity, the individual elements of the memory 501 are not shown in detail in FIG. 7. Further, the timing diagram for apparatus 700 is similar to that shown in FIGS. 6A to 6G, so a description thereof is not repeated.

A BIST address generator 720 provides the cell addresses in the desired address order for each march element. A BIST data generator 730 provides the data values in the desired pattern corresponding to each address provided. A BIST output data evaluator 760 checks the data read during the read operations and the W‖D operations. A BIST controller 710 activates the BIST address generator 720, BIST data generator 730, and BIST output data evaluator 760. BIST controller 710 operators from the same clock (CK) as the memory 501 and BIST output data evaluator 760. BIST controller is activated by the BIST signal, and is controlled by the BIST function control signal. BIST controller 710 receives a BIST complete signal from the BIST output data evaluator 760 at the completion of the BIST process.

BIST address generator 720 operates as a counter. The starting point for the counter and the direction (incrementing or decrementing the address) depend on which address order (ascending or descending) is used. The BIST controller sets the address order at the beginning of each march element. For W‖D operations, the address generator generates the address of the neighboring cell to be read in the disturb step by adding a constant to the write address (for ascending address order) or subtracting a constant from the write address (for descending address order). One of ordinary skill recognizes that this function may be performed, for example, by an up-down counter (capable of incrementing and decrementing) and a switch.

The data generating means may be a BIST data generator 730, which provides the patterns of data that are written to the memory 501. The BIST controller controls BIST data generator 730 to provide the patterns at the same time that the corresponding BIST addresses are generated by address generator 720. One of ordinary skill in the art recognizes that the implementation of the data generator depends on the patterns used.

A BIST controller 710 controls the sequence of reads and writes used in each march element of the test to map properly to the actual cell layout of the memory block 530.

The determining and detecting means may be a BIST output data evaluator 760. BIST controller 710 signals BIST output data evaluator 760 to identify which pattern is expected during any read or W‖D operations. BIST output data evaluator compares each datum read to the expected value, and identifies any deviations from the expected values.

During normal operation, the BIST signal is in the logic-low state. BIST address multiplexer 740 selects user defined addresses for read and write. BIST data multiplexer 750 selects the user data and bit write enable signals. Multiplexer 780 selects the write enable (WE) and chip select (CS) signals.

When a BIST operation is initiated, a BIST signal is received from an external source to configure the BIST circuitry to initiate the BIST process. The BIST signal is provided to the BIST controller 710, the BIST address multiplexer 740, multiplexer 780, and an inverter 770 (which provides an inverted BIST signal BISTN to the BIST data multiplexer 750).

When the BIST signal is received, multiplexer 740 selects the BIST address input from the BIST address generator 720; multiplexer 750 selects the BIST data from the BIST data generator 730. Multiplexer 780 selects the BIST write enable (WEB) and chip select (CS) signals, instead of the write enable (WE) and CS signals.

Advantageously, the BIST circuitry may be automatically activated by asserting the BIST signal each time memory device 501 is powered up. Alternatively, the BIST circuitry may be activated by manually activating the BIST signal.

Figure 8:
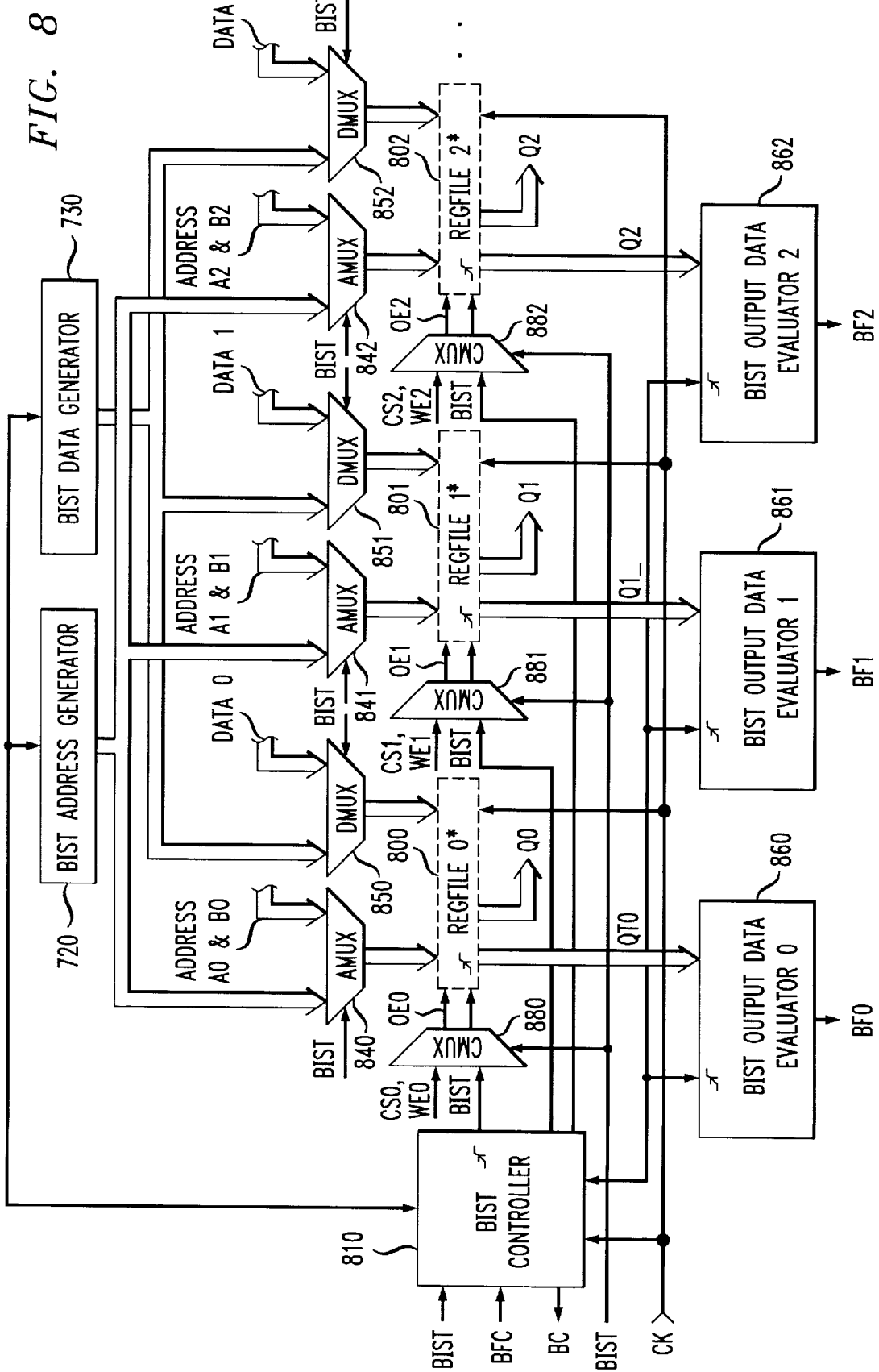
FIG. 8 is a block diagram of a plurality of memory devices having a shared built in self-test function using a method according to the invention.

FIG. 8 shows a further variation of the exemplary embodiment of FIG. 7. FIG. 8 shows a multiple parameterized register file memory test function. In a memory module containing a plurality of memories 800–802 (which may be, for example, register files of the type shown in FIG. 5), this variation provides BIST capability in parallel for each of the memories. At the same time, this variation shares some of the BIST functions across all of the memories 800–802, eliminating redundancy, and ensuring that all of the memories are tested identically.

In particular, a common clock signal, CK is used. The BIST address generator 720 and BIST data generator 730 may be identical to those shown in FIG. 7 and described above. The output of the BIST address generator 720 and BIST data generator 730 are provided to the respective multiplexers of each of the memories 800–802, as described below. The BIST controller 810 is similar to the BIST controller 710 described above, except that BIST controller 810 receives signals from a plurality of BIST output data evaluators 760–762.

Several components of the BIST circuitry shown in FIG. 7 are duplicated for each of the memory devices 800–802. For example, register file 800 receives an address from multiplexer 840. Multiplexer 840 selects either the BIST addresses if the BIST signal is in the logic-high state, or the user defined address if the BIST signal is in the logic-low state. Multiplexer 850 selects either the BIST data if the BIST signal is in the logic-high state, or the user defined data if the BIST signal is in the logic-low state. Multiplexer 880 transmits the chip select signal CS0 and write enable WE0 for memory 800. A BIST output data evaluator 860 determines whether the expected values are read from memory 800 during each read operation of the test, and detects errors.

Similarly, for the second memory 801, the same functions are provided by multiplexers 841, 851 and 881, and by BIST output data evaluator 861. For the third memory 802, the same functions are provided by multiplexers 842, 852 and 882, and by BIST output data evaluator 862.

One of ordinary skill in the art recognizes that the BIST circuitry can be configured in the manner shown in FIG. 8 to accommodate any number of memory devices, to provide common testing to all of the memory devices in a module simultaneously, in parallel.

It is understood that the present invention can be embodied in the form of computer-implemented test processes and test apparatus for practicing those processes. The present invention can also be embodied in the form of computer program code embodied in a tangible media, such as floppy diskettes, CD-ROMs, smart cards, hard disk drives, or any other computer-readable storage medium, wherein, when the computer program code is loaded into and executed by a computer, the computer becomes an apparatus for practicing the invention.

The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general purpose microprocessor, the computer program code segments configure the microprocessor to create specific logic circuits.

It will be understood that various changes in the details, materials and arrangements of the parts which have been described and illustrated above in order to explain the nature of this invention may be made by those skilled in the art without departing from the principles and scope of the invention. Although the invention has been described in terms of exemplary embodiments, it is not limited thereto. Rather, the appended claim should be construed broadly, to include other variants and embodiments of the invention which may be made by those skilled in the art without departing from the scope and range of equivalents of the invention.

What is claimed is:

1. A method for testing a multiport memory device, comprising the steps of:
   (a) writing a first datum in a first memory cell of a multiport memory device having a second memory cell that is a neighbor of the first memory cell;
   (b) reading a datum from the second memory cell while the first memory cell is being written to in step (a);
   (c) reading a datum from the second memory cell after executing step (b);
   (d) determining whether the datum read in step (c) matches a predetermined second datum; and
   (e) detecting a multiport-disturb fault in the memory device, if the datum read in step (c) does not match the second datum.

2. A method according to claim 1, further comprising the step of writing the second datum in the second memory cell before step (a).

3. A method according to claim 2, wherein respective iterations of steps (a) and (b) are performed corresponding to each respective memory cell in a first set of memory cells within the memory device.

4. A method according to claim 3, wherein:
   the iterations of steps (a) and (b) are performed in a single march element, and
   the method further comprises an additional march element in which each respective iteration of step (c) corresponds to a respective memory cell in a second set of memory cells within the memory device.

5. A method according to claim 1, further comprising the step of:
   (f) performing further write and read operations to detect at least one of the group consisting of stuck-at faults, transition faults, stuck-at-open faults, multi-access port faults, static single coupling faults, dynamic single coupling faults, linked transition and coupling faults, and addressing faults.

6. A method according to claim 1, wherein steps (a) through (e) are all performed using at least two different address orders.

7. Memory test apparatus for a multiport memory having first and second neighboring memory cells, comprising:
   means for writing a first datum in the first memory cell of the multiport memory;
   means for reading a content from the second memory cell of the multiport memory while that the first memory cell is being written to, and for reading the content from the second memory cell again after the first memory cell is written to;
   means for determining whether the content read from the second memory cell after the first memory cell is written to matches a predetermined second datum; and
   means for detecting a multiport-disturb fault in the memory device, if the second datum does not match the first datum.

8. Memory test apparatus according to claim 7, wherein the apparatus is included in a memory tester.

9. Memory test apparatus according to claim 7, wherein the apparatus is included in a built-in self test function of a memory device.

10. Memory test apparatus according to claim 7, wherein:

the writing means and reading means are included in a controller; and the determining means is an output data evaluator.

11. Memory test apparatus according to claim 7, further comprising a data generator for generating the first datum and the second datum.

12. A memory system according to claim 11, further comprising a multiplexer which selects, as a data input to the memory device, either an output of the data generator when the memory system is initially powered on, or a user-defined data value at other times.

13. Memory test apparatus according to claim 7, further comprising means for writing the second datum in the second memory cell before the first datum is written in the first memory cell.

14. Memory test apparatus according to claim 7, further comprising an address generator which generates and provides to the reading means:

a first address corresponding to the first memory cell, and a second address corresponding to the second memory cell, the first and second addresses differing from each other only in their least significant address bits, wherein the reading means causes the datum to be read from the second address while the corresponding memory cell at the first address is written to, wherein the address generator is capable of generating the first address and the second address in a first order and a second order opposite the first order.

15. A storage medium encoded with machine-readable computer program code for causing a memory test apparatus to test a multiport memory having first and second neighboring memory cells, the storage medium comprising:

means for causing the memory test apparatus to write a first datum in the first memory cell of the multiport memory;

reading means for causing the memory test apparatus to read a content from the second memory cell of the multiport memory while the first memory cell is being written to, and for reading the content from the second memory cell again after the first memory cell is written to;

means for causing the memory test apparatus to determine whether the content read from the second memory cell after the first memory cell is written to matches a predetermined second datum; and means for causing the memory test apparatus to detect a multiport-disturb fault in the memory device, if the second datum does not match the first datum.

16. A storage medium according to claim 15, further comprising means for causing the memory test apparatus to write the second datum in the second memory cell before the first datum is written in the first memory cell.

17. A storage medium according to claim 15, wherein the reading means causes the memory test apparatus to perform respective iterations of reading a content from the second memory cell at the same time that the first memory cell is being written to, each iteration corresponding to a respective memory cell in a first set of memory cells within the memory device.

18. A storage medium according to claim 17, wherein:

the iterations caused by the reading means are performed in a single march element, and the storage medium further comprises means for causing the memory test apparatus to perform an additional march element in which respective iterations are performed for determining whether the content read from the second memory cell after the first memory cell is written to matches a predetermined second datum, each iteration corresponding to a respective memory cell in a second set of memory cells within the memory device.

19. A storage medium according to claim 15, further comprising means for causing the memory test apparatus to perform further write and read operations to detect at least one of the group consisting of stuck-at faults, transition faults, stuck-at-open faults, multi-access port faults, static single coupling faults, dynamic single coupling faults, linked transition and coupling faults, and addressing faults.

* * * * *